United States Patent
Lim et al.

(10) Patent No.: US 9,449,973 B2
(45) Date of Patent: Sep. 20, 2016

(54) SEMICONDUCTOR DEVICE

(71) Applicant: Samsung Electronics Co., Ltd., Suwon-Si, Gyeonggi-Do (KR)

(72) Inventors: Han-jin Lim, Seoul (KR); Kong-soo Lee, Hwaseong-si (KR); Seok-woo Nam, Seongnam-si (KR); Dong-chan Kim, Anyang-si (KR); Soo-jin Hong, Guri-si (KR)

(73) Assignee: Samsung Electronics Co., Ltd., Geyonggi-do (KR)

(*) Notice: Subject to any disclaimer, the term of this patent is extended or adjusted under 35 U.S.C. 154(b) by 0 days.

(21) Appl. No.: 14/263,119

(22) Filed: Apr. 28, 2014

(65) Prior Publication Data

US 2015/0060862 A1 Mar. 5, 2015

(30) Foreign Application Priority Data

Sep. 5, 2013 (KR) .................. 10-2013-0106821

(51) Int. Cl.
| | | |
|---|---|---|
| G11C 7/10 | (2006.01) |
| H01L 27/092 | (2006.01) |
| H01L 27/06 | (2006.01) |
| G11C 11/4091 | (2006.01) |
| G11C 7/06 | (2006.01) |
| H01L 27/11 | (2006.01) |

(52) U.S. Cl.
CPC ............. *H01L 27/092* (2013.01); *G11C 7/065* (2013.01); *G11C 11/4091* (2013.01); *H01L 27/0688* (2013.01); *H01L 27/1108* (2013.01)

(58) Field of Classification Search
CPC ........ H01L 2924/1437; H01L 27/11–27/1116; H01L 27/092; H01L 27/1108; G11C 11/4091
See application file for complete search history.

(56) References Cited

U.S. PATENT DOCUMENTS

| | | | |
|---|---|---|---|
| 8,241,989 B2 | 8/2012 | Hofmann | |
| 2002/0197794 A1 | 12/2002 | Lee | |
| 2005/0151276 A1 | 7/2005 | Jang et al. | |
| 2005/0285162 A1 | 12/2005 | Kim et al. | |
| 2006/0114628 A1* | 6/2006 | Fukuda | ............... 361/56 |
| 2006/0134894 A1 | 6/2006 | Yin et al. | |
| 2006/0211262 A1 | 9/2006 | Son et al. | |
| 2006/0263950 A1 | 11/2006 | Kim et al. | |
| 2007/0023794 A1 | 2/2007 | Kang et al. | |
| 2007/0045671 A1 | 3/2007 | Kim et al. | |
| 2007/0170433 A1 | 7/2007 | Son et al. | |
| 2008/0283873 A1 | 11/2008 | Yang et al. | |
| 2009/0278060 A1* | 11/2009 | Taniguchi et al. | ....... 250/492.22 |
| 2009/0294861 A1* | 12/2009 | Thomas et al. | ............. 257/368 |
| 2011/0237055 A1 | 9/2011 | Son et al. | |
| 2011/0272775 A1 | 11/2011 | Kim et al. | |
| 2013/0095580 A1* | 4/2013 | Or-Bach et al. | ............... 438/17 |

FOREIGN PATENT DOCUMENTS

JP 2011040616 A 2/2011

* cited by examiner

*Primary Examiner* — Cuong B Nguyen
(74) *Attorney, Agent, or Firm* — Harness, Dickey & Pierce P.L.C

(57) ABSTRACT

A semiconductor device includes a substrate; a first inverter disposed on the substrate and receiving a voltage from any one of a bit line and a complementary bit line; a semiconductor layer disposed on the first inverter; and first and third switch devices disposed on the semiconductor layer and adjusting a threshold voltage of the first inverter to a voltage level of any one of the bit line and the complementary bit line.

20 Claims, 13 Drawing Sheets

SEMICONDUCTOR DEVICE

CROSS-REFERENCE TO RELATED APPLICATIONS

This application claims the benefit of Korean Patent Application No. 10-2013-0106821, filed on Sep. 5, 2013, in the Korean Intellectual Property Office, the disclosure of which is incorporated herein in its entirety by reference.

BACKGROUND

The example embodiments of the inventive concepts relate to a semiconductor device included in a sense amplifier, and more particularly, to a semiconductor device configured to perform a mismatch compensation.

Semiconductor memory devices may need to have high capacities and low power while performing high speed operations to satisfy user demand. However, increasing the capacity of the semiconductor memory devices may cause a loading mismatch phenomenon between a bit line and a complementary bit line, which are connected to a sense amplifier, or a threshold voltage mismatch phenomenon between transistors in a sense amplifier is generated. Such a loading mismatch phenomenon or threshold voltage mismatch phenomenon may cause a sensing efficiency, such as a sensing margin and a sensing speed, of the sensing amplifier to deteriorate.

In order to increase the sensing efficiency of the sensing amplifier, a switch device may be connected to MOS transistors forming cross-coupled inverters. However, in this case, an area occupied by the sense amplifier is increased due to the switch device, whereas a cell area of a semiconductor memory device is decreased. Further, if the switch device is additionally disposed while preventing the decrease in the cell area, it is difficult to obtain a process margin, and thus a contact pattern may have defects.

SUMMARY

Example embodiments of the inventive concepts provide a semiconductor device which has a high sensing efficiency via mismatch compensation while obtaining a process margin and having a small size.

According to an example embodiment of the inventive concepts, there is provided a semiconductor device including: a substrate; a first inverter disposed on the substrate and receiving a voltage from any one of a bit line and a complementary bit line; a semiconductor layer disposed on the first inverter; and first and second switch devices disposed on the semiconductor layer and adjusting a threshold voltage of the first inverter to a voltage level of any one of the bit line and the complementary bit line.

The semiconductor layer may be formed of polycrystalline silicon.

The semiconductor layer may include a channel region of each of the first and second switch devices, wherein the channel region may be fully depleted.

The semiconductor layer may include a common source region and drain regions of the first and second switch devices, wherein bottom surfaces of the common source region and the drain regions of the first and second switch devices may be coplanar with a bottom surface of the semiconductor layer.

The first inverter may include a pair of NMOS and PMOS transistors, the substrate may include source and drain regions of each of the NMOS and PMOS transistors, and the source and drain regions of each of the NMOS and PMOS transistors may be separate from a bottom surface of the substrate.

The first inverter may include a pair of NMOS and PMOS transistors, the substrate may include a channel region of each of the NMOS and PMOS transistors, which extends in a first direction, and the semiconductor layer may include a channel region of each of the first and second switch devices, which extends in the first direction.

The first inverter may include a pair of NMOS and PMOS transistors, the substrate may include a channel region of each of the NMOS and PMOS transistors, which extends in a first direction, and the semiconductor layer may include a channel region of each of the first and second switch devices, which extends in a second direction that is different from the first direction.

The first inverter may include a pair of NMOS and PMOS transistors, the NMOS and PMOS transistors may each include: a channel region disposed on the substrate; source and drain regions respectively disposed on two sides of the channel region on the substrate; and a gate structure disposed on the channel region, one of the source and drain regions of the NMOS transistor may be electrically connected to one of the source and drain regions of the PMOS transistor, and the gate structure of the NMOS transistor may be electrically connected to the gate structure of the PMOS transistor.

The first and second switch devices may each include: a channel region disposed on the semiconductor layer; a common source region and a drain region respectively disposed on two sides of the channel region on the semiconductor layer; and a gate structure disposed on the channel region, wherein the first and second switch devices may share the common source region.

The bit line and the complementary bit line may be disposed on the first and second switch devices, the complementary bit line may be electrically connected to a drain region of the first switch device disposed on the semiconductor layer, and the bit line may be electrically connected to a drain region of the second switch device disposed on the semiconductor layer.

The semiconductor device may further include: a second inverter disposed on the substrate, cross-coupled to the first inverter, and receiving a voltage from any one of the bit line and the complementary bit line; and third and fourth switch devices disposed on the semiconductor layer and adjusting a threshold voltage of the second inverter to a voltage level of any one of the bit line and the complementary bit line.

A pair of the first and third switch devices may exclusively operate from a pair of the second and fourth switch devices.

According to another example embodiment of the inventive concepts, there is provided a sense amplifier including the semiconductor device above.

According to another example embodiment of the inventive concepts, there is provided a semiconductor device including: first and second inverters disposed on a substrate, cross-coupled between a bit line and a complementary bit line, and sensing a difference between voltage levels of the bit line and the complementary bit line; and first and second switch device groups disposed on a semiconductor layer at a higher level than the substrate, and correspondingly adjusting threshold voltages of the first and second inverters to a voltage level of any one of the bit line and the complementary bit line.

The semiconductor layer may be formed of polycrystalline silicon.

In one example embodiment, the semiconductor device has a substrate and a semiconductor layer formed on the substrate. The device includes a first inverter and a second inverter on the substrate; and switches on the semiconductor layer, the switches configured to set a threshold voltage of the first inverter and a threshold voltage of the second inverter to a same voltage level.

In at least one embodiment, the switches include first switching devices and second switching devices. The first switching devices configured to selectively connect an output terminal and an input terminal of the first inverter to a same first one of a bit line and a complementary bit line in a matching phase and. The second switching devices configured to selectively connect an output terminal and an input terminal of the second inverter to a same second one of the bit line and the complementary bit line in the matching phase.

In at least one embodiment, the switches are disposed at a different layer from the first inverter and the second inverter.

In at least one embodiment, each of the switches includes a source, a channel and a drain, and the source, the channel and the drain of the switches is formed on the semiconductor layer, the source being a common source shared between.

In at least one embodiment, each of the first inverter and the second inverter includes an NMOS transistor and a PMOS transistor, the NMOS transistor and the PMOS transistor each have a source and a drain, and the source and the drain of the NMOS transistor and the PMOS transistor are formed on the substrate.

BRIEF DESCRIPTION OF THE DRAWINGS

Example embodiments of the inventive concepts will be more clearly understood from the following detailed description taken in conjunction with the accompanying drawings in which:

FIG. 3 is a diagram for describing operations of the semiconductor device of FIG. 1, when first and third switch devices are turned off and second and fourth switch devices are turned on;

DETAILED DESCRIPTION OF THE EMBODIMENTS

Figure 1:
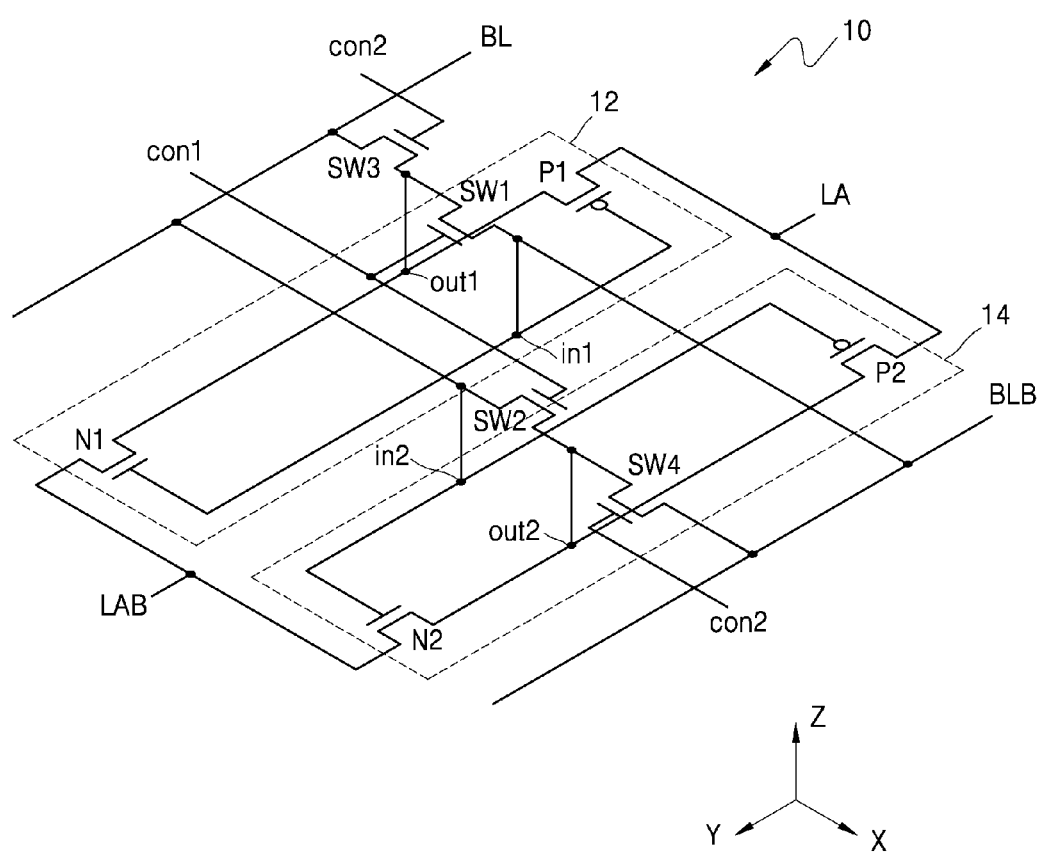
FIG. 1 is an equivalent circuit diagram of a semiconductor device according to an example embodiment of the inventive concepts.

Hereinafter, the inventive concepts will be described more fully with reference to the accompanying drawings, in which example embodiments of the inventive concepts are shown. Like reference numerals in the drawings denote like elements.

These inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts. For example, a first element may be designated as a second element, and similarly, a second element may be designated as a first element without departing from the teachings of the inventive concepts.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

When a certain embodiment may be implemented differently, a specific process order may be performed differently from the described order. For example, two consecutively described processes may be performed substantially at the same time or performed in an order opposite to the described order.

Variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing.

Various example embodiments will now be described more fully with reference to the accompanying drawings in which some example embodiments are shown. In the drawings, the thicknesses of layers and regions are exaggerated for clarity.

FIG. 1 is an equivalent circuit diagram of a semiconductor device 10 according to an example embodiment of the inventive concepts.

Referring to FIG. 1, while each of first through fourth switch devices SW1 through SW4 are shown as transistors, example embodiments are not limited thereto, and the first through fourth switch devices SW1 through SW4 may be a transmission gate. For convenience of description, it is assumed that the first through fourth switch devices SW1 through SW4 are transistors.

The semiconductor device 10 may be a sense amplifier that senses and amplifies a potential difference between a bit line BL and a complementary bit line BLB. The semiconductor device 10 may include first and second inverters 12 and 14, and the first through fourth switch devices SW1 through SW4. The first and second inverters 12 and 14, and the first through fourth switch devices SW1 through SW4 may be disposed on different planes along a Z direction. In other words, a semiconductor layer 200 of FIG. 4B, on which the first through fourth switch devices SW1 through SW4 are disposed, is disposed on a semiconductor substrate 100 of FIG. 4B, on which the first and second inverters 12 and 14 are disposed, and the first through fourth switch devices SW1 through SW4 may be perpendicularly stacked on the first and second inverters 12 and 14.

The first and second inverters 12 and 14 may be cross-coupled between the bit line BL and the complementary bit line BLB. In detail, the first inverter 12 may include a pair of a first PMOS transistor P1 and a first NMOS transistor N1, and an input terminal in1 of the first inverter 12 may be connected to the complementary bit line BLB to receive a voltage of the complementary bit line BLB. The second inverter 14 may include a pair of a second PMOS transistor P2 and a second NMOS transistor N2, and an input terminal in2 of the second inverter 14 may be connected to the bit line BL to receive a voltage of the bit line BL. Also, a terminal of the first PMOS transistor P1 may be connected to a terminal of the second PMOS transistor P2, and a terminal of the first NMOS transistor N1 may be connected to a terminal of the second NMOS transistor N2.

In FIG. 1, the first and second inverters 12 and 14 are cross-coupled such that the first inverter 12 receives the voltage of the complementary bit line BLB and the second inverter 14 receives the voltage of the bit line BL, but example embodiments are not limited thereto. For example, according to another example embodiment, the first and second inverters 12 and 14 may be cross-coupled in a manner opposite to that shown in FIG. 1 between the bit line BL and the complementary bit line BLB. For example, the first and second inverters 12 and 14 may be cross-coupled such that the first inverter 12 receives the voltage of the bit line BL and the second inverter 14 receives the voltage of the complementary bit line BLB.

The first switch device SW1 may be connected between the input terminal in1 and an output terminal out1 of the first inverter 12. A terminal of the first switch device SW1 may be connected to the complementary bit line BLB through the input terminal in1 of the first inverter 12. Another terminal of the first switch device SW1 may be connected to a terminal of the second switch device SW3 through the output terminal out1 of the first inverter 12. Another terminal of the second switch device SW3 may be connected to the bit line BL.

The third switch device SW2 may be connected between the input terminal in2 and an output terminal out2 of the second inverter 14. A terminal of the third switch device SW2 may be connected to the bit line BL through the input terminal in2 of the second inverter 14. Another terminal of the third switch device SW2 may be connected to a terminal of the fourth switch device SW4 through the output terminal out2 of the second inverter 14. Another terminal of the fourth switch device SW4 may be connected to the complementary bit line BLB.

When the first and second inverters 12 and 14 are cross-coupled such that the first inverter 12 receives the voltage of the bit line BL and the second inverter 14 receives the voltage of the complementary bit line BLB as described above, the second switch device SW3 may connect the output terminal out1 of the first inverter 12 to the complementary bit line BLB and the fourth switch device SW4 may connect the output terminal out2 of the second inverter 14 to the bit line BL, unlike shown in FIG. 1.

The first and third switch devices SW1 and SW2 may be turned on or off by a first control signal con1. For example, the first switch device SW1 may be turned on when the first control signal con1 is logic high to connect the input terminal in1 and the output terminal out1 of the first inverter 12. The third switch device SW2 may be turned on when the first control signal con1 is logic high to connect the input terminal in2 and the output terminal out2 of the second inverter 14.

The second and fourth switch devices SW3 and SW4 may be turned on or off by a second control signal con2. For example, the second switch device SW3 may be turned on when the second control signal con2 is logic high to connect the output terminal out1 of the first inverter 12 and the bit line BL. The fourth switch device SW4 may be turned on when the second control signal con2 is logic high to connect the output terminal out2 of the second inverter 14 and the complementary bit line BLB.

A pair of the first and third switch devices SW1 and SW2 and a pair of the second and fourth switch devices SW3 and SW4 may exclusively operate. Thus, the first and second control signals con1 and con2 may have an inverse relationship therebetween.

In FIG. 1, the semiconductor device 10 includes all of the first through fourth switch devices SW1 through SW4, but example embodiments are not limited thereto. According to another example embodiment, the semiconductor device 10 may only include the first and second switch devices SW1 and SW3, which are connected to the first inverter 12. According to another example embodiment, the semiconductor device 10 may only include the third and fourth switch devices SW2 and SW4, which are connected to the second inverter 14.

Figure 2:
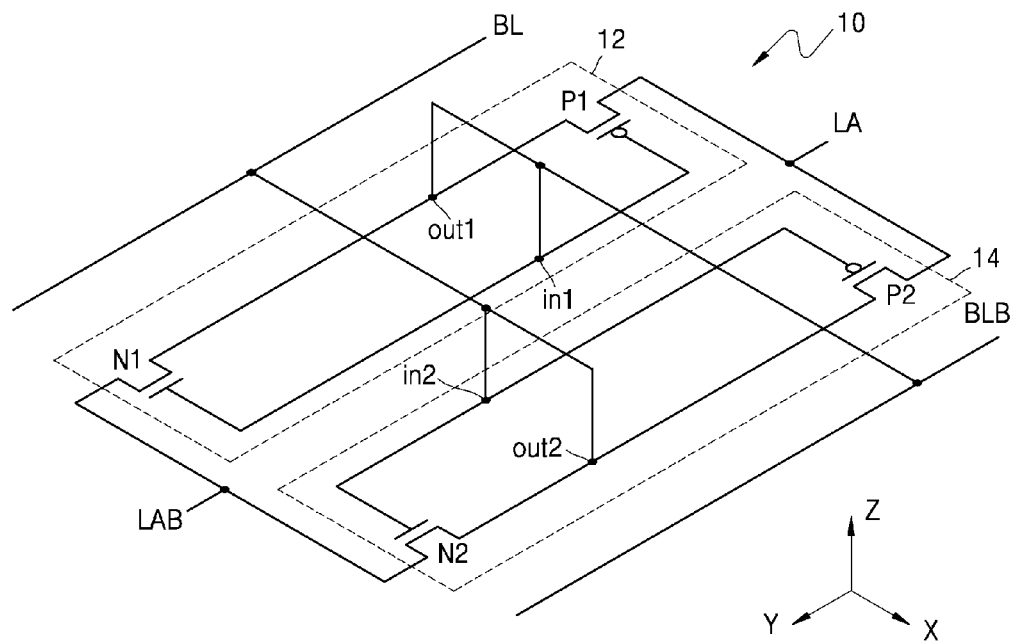
FIG. 2 is a diagram for describing operations of the semiconductor device of FIG. 1, when first and third switch devices are turned on and second and fourth switch devices are turned off.

FIG. 2 is a diagram for describing operations of the semiconductor device 10 of FIG. 1, when the first and third switch devices SW1 and SW2 are turned on and the second and fourth switch devices SW3 and SW4 are turned off.

Referring to FIG. 2, when the first control signal con1 is logic high and the second control signal con2 is logic low in the semiconductor device 10, the input and output terminals in1 and out1 of the first inverter 12 are connected to the complementary bit line BLB, and the input and output terminals in2 and out2 of the second inverter 14 are connected to the bit line BL. Accordingly, the threshold voltage of the first inverter 12 is adjusted to the voltage level of the complementary bit line BLB, and the threshold voltage of the second inverter 14 is adjusted to the voltage level of the bit line BL.

As such, the voltage levels of the threshold voltages of the first and second inverters 12 and 14 are adjusted, and thus when a difference between the threshold voltages of the first and second inverters 12 and 14 is applied (or, alternatively pre-applied) as a difference between the voltage levels of the bit line BL and the complementary bit line BLB, a threshold voltage mismatch between the first and second inverters 12 and 14 may be compensated for in a matching phase.

Figure 3:
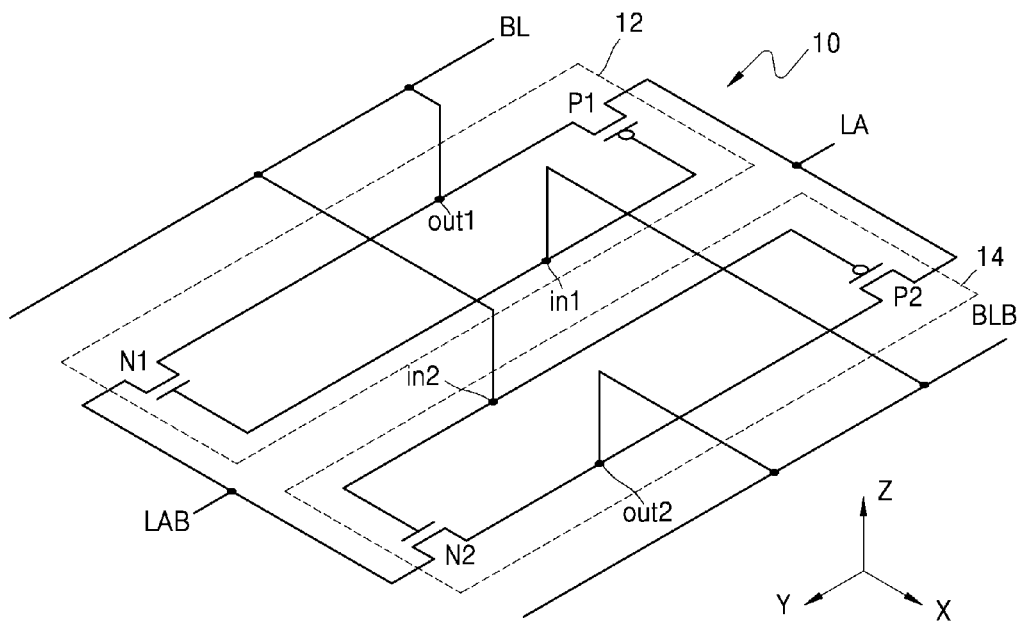

FIG. 3 is a diagram for describing operations of the semiconductor device 10 of FIG. 1, when the first and third switch devices SW1 and SW2 are turned off and the second and fourth switch devices SW3 and SW4 are turned on.

Referring to FIG. 3, when the first control signal con1 is logic low and the second control signal con2 is logic high in the semiconductor device 10, the input terminal in1 of the first inverter 12 is connected to the complementary bit line BLB and the output terminal out1 of the first inverter 12 is connected to the bit line BL, and the input terminal in2 of the second inverter 14 is connected to the bit line BL and the output terminal out2 of the second inverter 14 is connected to the complementary bit line BLB.

In this case, the semiconductor device 10 operates like a general sense amplifier circuit, and senses and amplifies the potential difference between the bit line BL and the complementary bit line BLB.

As such, according to the semiconductor device 10, by controlling the first through fourth switch devices SW1 through SW4, a mismatch between the first and second inverters 12 and 14 may be compensated for in the matching phase to improve a sensing efficiency. Also, by perpendicularly disposing the first through fourth switch devices SW1 through SW4 in a different level from the first and second inverters 12 and 14, the semiconductor device 10 may efficiently use a limited layout area, as will be described in detail later.

Figure 4A:
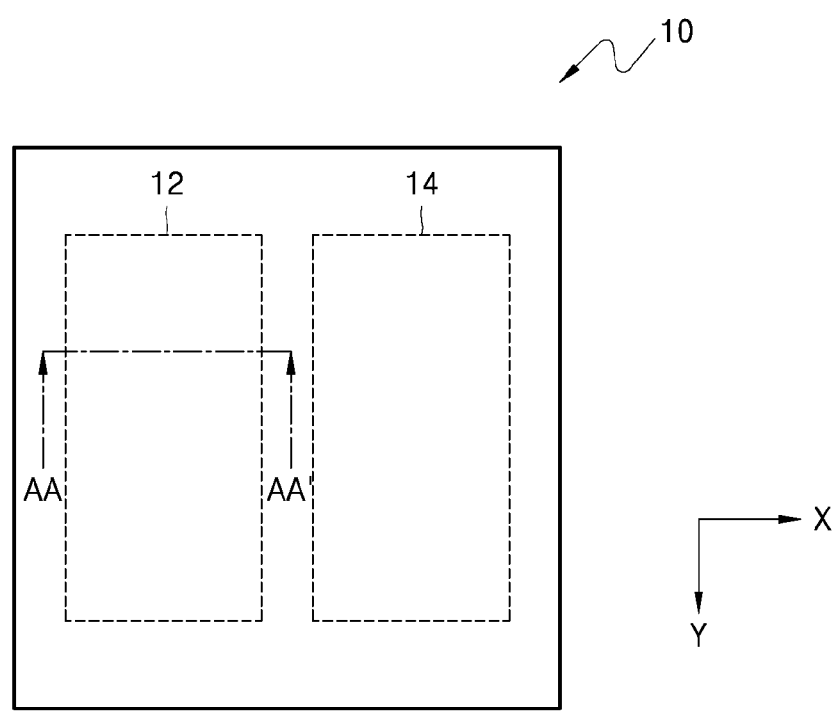
FIG. 4A is a schematic plan layout of the semiconductor device of FIG. 1.
Figure 4B:
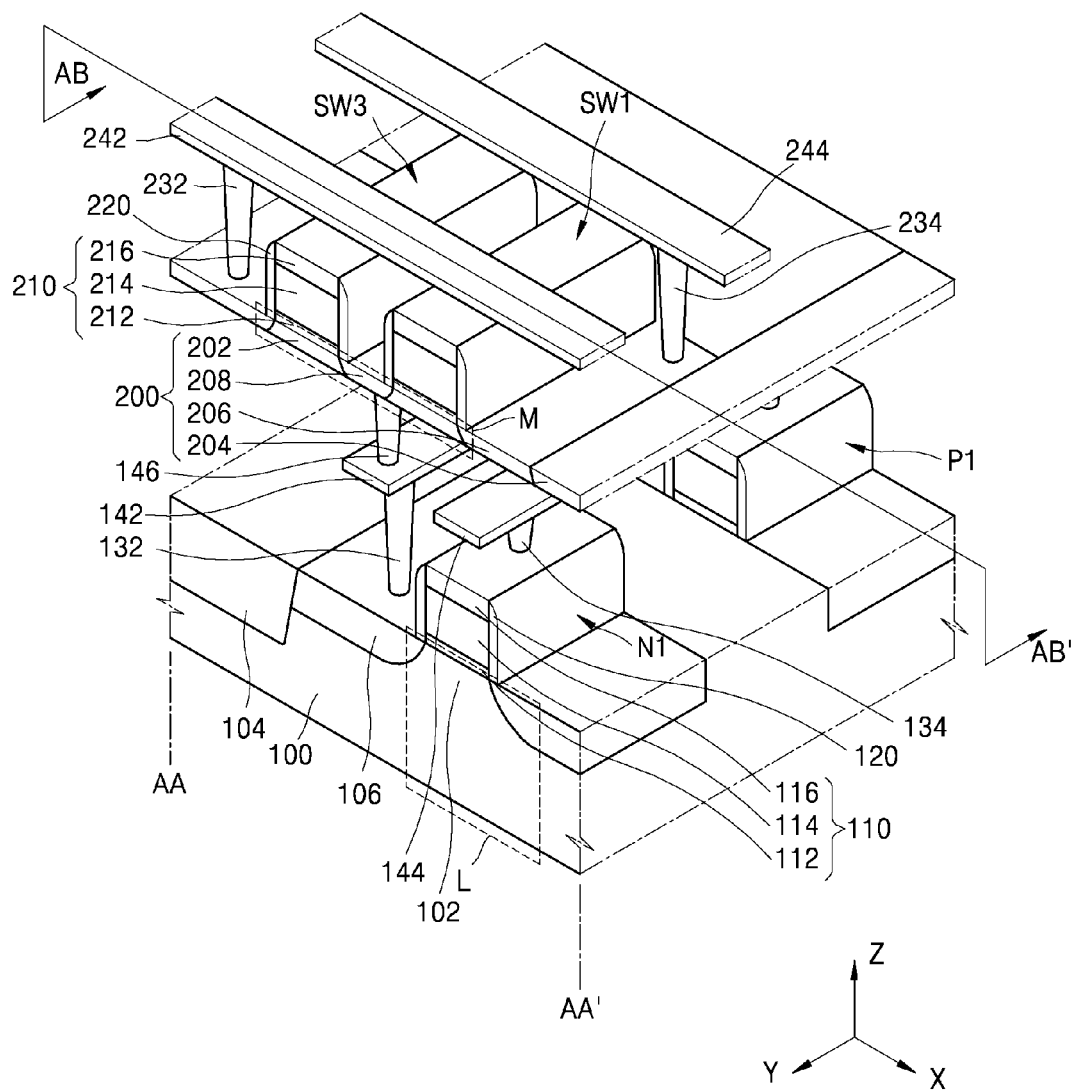
FIG. 4B is a cross-sectional view of elements taken along line AA-AA' of FIG. 4A.
Figure 4C:
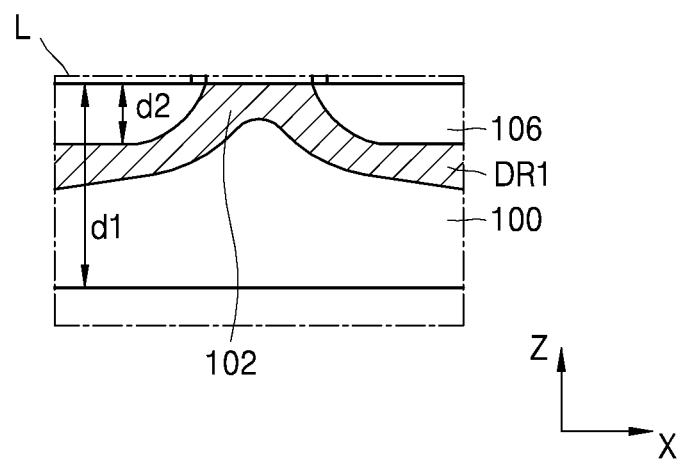
FIG. 4C is an enlarged cross-sectional view of a region L of FIG. 4B.
Figure 4D:
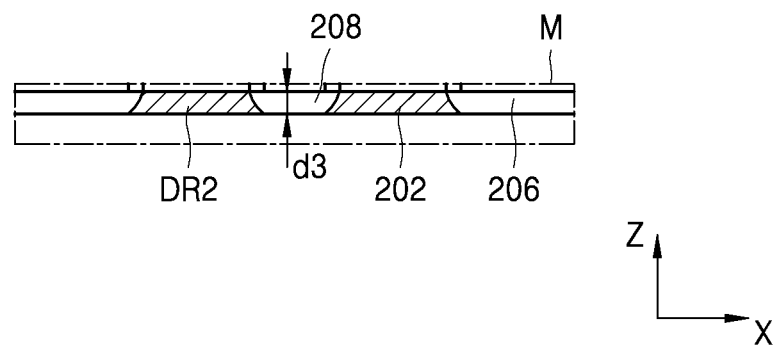
FIG. 4D is an enlarged cross-sectional view of a region M of FIG. 4B.

FIG. 4A is a schematic plan layout of the semiconductor device 10 of FIG. 1, FIG. 4B is a cross-sectional view of elements taken along line AA-AA' of FIG. 4A, FIG. 4C is an enlarged cross-sectional view of a region L of FIG. 4B, and FIG. 4D is an enlarged cross-sectional view of a region M of FIG. 4B. In FIGS. 4A and 4B, interlayer dielectric layers are not shown for convenience of description.

Referring to FIGS. 4A and 4B, an isolating film 104 for defining an active region is formed on the semiconductor substrate 100.

The semiconductor substrate 100 may include silicon, such as single crystalline silicon, polycrystalline silicon, or amorphous silicon. According to an example embodiment, the semiconductor substrate 100 may include a semiconductor or compound semiconductor, such as germanium, silicon germanium, silicon carbide, gallium arsenide, indium arsenide, or indium phosphide. According to an example embodiment, the semiconductor substrate 100 may have a silicon-on-insulator (SOI) structure. For example, the semiconductor substrate 100 may include a buried oxide layer (BOL). According to another example embodiment, the semiconductor substrate 100 may include a conductive region, for example, an impurity-doped well or impurity-doped structure.

The isolating film 104 may have a structure in which a plurality of trenches having a desired (or, alternatively a predetermined) depth in a Z direction from a top surface of the semiconductor substrate 100, extending in a Y direction, and separate from each other are filled with an insulating material. The insulating material may be at least one material selected from silicon oxide, silicon nitride, and silicon oxynitride. According to an example embodiment, the isolating film 104 may include a liner dielectric film covering inner side walls and bottom surfaces of the trenches, and a capping dielectric film on the liner dielectric film. In this case, the liner dielectric film may be formed of silicon nitride, and the capping dielectric film may be formed of silicon oxide. A bottom surface of the isolating film 104 may be separate from a bottom surface of the semiconductor substrate 100. The isolating films 104 may define an active region where a device is formed. A source/drain region 106 is formed in the active region defined by the isolating films 104, and a channel region 102 is defined by source/drain regions 106.

Referring to FIG. 4C, the source/drain region 106 having a thickness d2 in the Z direction may be formed by doping the semiconductor substrate 100 having a thickness d1 in the Z direction with n- or p-type impurities. The thickness d2 may be smaller than the thickness d1. Thus, the bottom surface of the source/drain region 106 may be separate from the bottom surface of the semiconductor substrate 100. A depletion region DR1 may be formed between the semiconductor substrate 100 and the source/drain region 106 so that the channel region 102 is partially depleted. However, alternatively, the channel region 102 may be fully depleted. The bottom surface of the source/drain region 106 may be disposed at a higher level than the bottom surface of the isolating film 104 based on the bottom surface of the semiconductor substrate 100.

The source/drain region 106 may extend in the Y direction. The source/drain region 106 may be intermittently formed in the Y direction, and different types of impurities may be doped according to intermittent regions.

According to an example embodiment, a metal silicide layer (not shown) may be formed on the source/drain region 106. The metal silicide layer may include a metal silicide material, such as tungsten silicide, nickel silicide, tantalum silicide, or cobalt silicide.

The channel region 102 may be a region between the source/drain regions 106 adjacent to each other on the semiconductor substrate 100. The channel region 102 may have a width in an X direction corresponding to a distance between the adjacent source/drain regions 106, and may extend along the Y direction.

Referring to FIG. 4B, a gate structure 110 is disposed on the channel region 102. A spacer 120 is disposed on a side wall of the gate structure 110.

In terms of a plane, the gate structure 110 may have a line shape extending in the Y direction. The gate structure 110 may have an intermittent line shape in the Y direction according to the source/drain region 106, and transistors may be defined according to the intermittent line shape of the gate structure 110 and the source/drain region 106. The transistors shown in FIG. 4 may respectively correspond to the first NMOS transistor N1 and the first PMOS transistor P1 of the first inverter 12 of FIG. 1.

The gate structure 110 may include a gate dielectric film pattern 112, a gate electrode pattern 114, and a capping pattern 116, which are sequentially stacked on each other. The gate dielectric film pattern 112 may include at least one selected from oxide, nitride, oxynitride, and a high-k material. The high-k material may have an insulating material having a higher dielectric constant than the nitride. For example, the high-k material may be at least one selected from insulating metal oxides, such as hafnium oxide and aluminum oxide. The gate electrode pattern 114 may be formed of a conductive material. The conductive material may include at least one selected from a doped semiconductor, conductive metal nitride, or a metal. Examples of the conductive metal nitride include titanium nitride, tantalum nitride, and tungsten nitride. Examples of the metal include ruthenium, iridium, titanium, tungsten, and tantalum. The capping pattern 116 may be formed of an insulating material. For example, the insulating material may include at least one selected from oxide, nitride, and oxynitride.

According to an example embodiment, a metal silicide pattern (not shown) may be disposed between the gate electrode pattern 114 and the capping pattern 116. The metal silicide pattern may be formed of a metal silicide material, such as tungsten silicide, nickel silicide, tantalum silicide, or cobalt silicide.

The spacer 120 may cover the side wall of the gate structure 110 and may partially cover the top surface of the source/drain region 106. A thickness of the spacer 120 may vary in the Z direction. For example, the thickness of the spacer 120 may gradually decrease from the top surface of the semiconductor substrate 100 to a top surface of the gate structure 110. The spacer 120 may include at least one insulating material selected from oxide, nitride, and oxynitride.

In FIG. 4B, a bottom surface of the gate structure 110 contacts a top surface of the channel region 102, but example embodiment of the inventive concepts are not limited thereto. At least a part of the gate electrode pattern 114 may be embedded in the channel region 102. In this case, the gate dielectric film pattern 112 may have a U-shape.

A source/drain region at one side of the first NMOS transistor N1 and a source/drain region at one side of the first PMOS transistor P1 are electrically connected to each other.

In detail, first plugs 132 extending in the Z direction are formed on the source/drain region at one side of the first NMOS transistor N1 and on the source/drain region at one side of the first PMOS transistor P1. The first plugs 132 are connected to a first conductive line 142 extending in the Y direction so that the source/drain region at one side of the first NMOS transistor N1 and the source/drain region at one side of the first PMOS transistor P1 are electrically connected to each other. Accordingly, the output terminal out1 of the pair of the first NMOS transistor N1 and the first PMOS transistor P1 included in the first inverter 12 of FIG. 1 may be formed.

A gate structure of the first NMOS transistor N1 and a gate structure of the first PMOS transistor P1 are electrically connected to each other.

In detail, second plugs 134 extending in the Z direction are formed on the gate structure of the first NMOS transistor N1 and on the gate structure of the first PMOS transistor P1. The second plugs 134 are connected to a second conductive line 144 extending in the Y direction so that the gate structure of the first NMOS transistor N1 and the gate structure of the first PMOS transistor P1 are electrically connected to each other. Accordingly, the input terminal in1 of the pair of the first NMOS transistor N1 and the first PMOS transistor P1 included in the first inverter 12 of FIG. 1 may be formed.

The first and second plugs 132 and 134, and the first and second conductive lines 142 and 144 may include a conductive material. Examples of the conductive material include aluminum, copper, silver, and gold.

The semiconductor layer 200 is disposed on the first and second conductive lines 142 and 144. An isolating film 204 defining an active region is disposed on the semiconductor layer 200.

The semiconductor layer 200 may be formed of polycrystalline silicon.

The isolating film 204 may be a region of an insulating material, which has a thickness from a top surface to a bottom surface of the semiconductor layer 200 and extends in the Y direction. The insulating material may be at least one selected from silicon oxide, silicon nitride, and silicon oxynitride. According to an example embodiment, the isolating film 204 may include a liner dielectric film and a capping dielectric film, like the isolating film 104 formed on the semiconductor substrate 100. A bottom surface of the isolating film 204 may be coplanar with the bottom surface of the semiconductor layer 200. The isolating film 204 may define an active region where a device is formed.

A drain region 206 and a common source region 208 are formed in the active region defined by the isolating film 204, and a channel region 202 is defined by the drain region 206 and the common source region 208.

Referring to FIG. 4D, the drain region 206 and the common source region 208 may be formed by doping from the top surface to the bottom surface of the semiconductor layer 200 along the Z direction with n- or p-type impurities. Bottom surfaces of the drain region 206 and the common source region 208 may be coplanar with the bottom surface of the semiconductor layer 200. In other words, the semiconductor layer 200, the drain region 206, and the common source region 208 each have a thickness d3 in the Z direction. A depletion region DR2 is formed between the drain region 206 and the common source region 208 in the semiconductor layer 200, and the channel region 202 may be fully depleted. Here, the thickness d3 may be from about 5 to about 20 nm.

The drain region 206 and the common source region 208 may extend in the Y direction. The drain region 206 and the common source region 208 may be intermittently formed in the Y direction.

According to an example embodiment, a metal silicide layer (not shown) may be formed on the drain region 206 and the common source region 208. The metal silicide layer may include a metal silicide material, such as tungsten silicide, nickel silicide, tantalum silicide, or cobalt silicide.

The channel region 202 may be a region between the drain region 206 and the common source region 208 adjacent to each other in the semiconductor layer 200. The channel region 202 may have a width corresponding to a distance between the drain region 206 and the common source region 208 adjacent to each other, and may extend along the Y direction.

A gate structure 210 is formed on the channel region 202. A spacer 220 is disposed on a side wall of the gate structure 210.

The gate structure 210 may have a line shape extending in the Y direction. The gate structure 210 may have an intermittent line shape in the Y direction according to the drain region 206 and the common source region 208. Transistors may be defined according to the drain region 206 and the common source region 208 adjacent to each other, and the gate structures 210 disposed on the channel region 202 disposed between the drain region 206 and the common source region 208 adjacent to each other. The transistors shown in FIG. 4B may respectively correspond to the first and second switch devices SW1 and SW3 of FIG. 1. The first and second switch devices SW1 and SW3 may form first switching devices. Likewise, the third and fourth switch devices SW2 and SW4 may form second switching devices.

The gate structure 210 may include a gate dielectric film pattern 212, a gate electrode pattern 214, and a capping pattern 216, which are sequentially stacked on each other. The gate dielectric film pattern 212 may include at least one selected from oxide, nitride, oxynitride, and a high-k material. The high-k material may have an insulating material having a higher dielectric constant than the nitride. For example, the high-k material may be at least one selected from insulating metal oxides, such as hafnium oxide and aluminum oxide. The gate electrode pattern 214 may be formed of a conductive material. The conductive material may include at least one selected from a doped semiconductor, conductive metal nitride, or a metal. Examples of the conductive metal nitride include titanium nitride, tantalum nitride, and tungsten nitride. Examples of the metal include ruthenium, iridium, titanium, tungsten, and tantalum. The capping pattern 216 may be formed of an insulating material. For example, the insulating material may include at least one selected from oxide, nitride, and oxynitride.

According to an example embodiment, a metal silicide pattern (not shown) may be disposed between the gate electrode pattern 214 and the capping pattern 216. The metal silicide pattern may be formed of a metal silicide material, such as tungsten silicide, nickel silicide, tantalum silicide, or cobalt silicide.

The spacer 220 may cover the side wall of the gate structure 210, and may cover at least a part of each of the drain region 206 and the common source region 208. A thickness of the spacer 220 in the X direction may vary along the Z direction. For example, the thickness of the spacer 220 in the X direction may decrease from the top surface of the semiconductor layer 200 to the top surface of the gate structure 210. The spacer 220 may include at least one selected from oxide, nitride, and oxynitride.

The first and second switch devices SW1 and SW3 share the common source region 208 as a source region. The common source region 208 of the first and second switch devices SW1 and SW3 is electrically connected to the first conductive line 142 through third plugs 146. In other words, the first and second switch devices SW1 and SW3 may be electrically connected to the output terminal out1 of the first inverter 12 of FIG. 1.

A drain region at one side of the second switch device SW3 is electrically connected to a third conductive line 242 extending in the X direction.

In detail, a fourth plug 232 extending in the Z direction is formed on the drain region at one side of the second switch device SW3. The fourth plug 232 is connected to the third conductive line 242, and thus the drain region at one side of the second switch device SW3 is electrically connected to the third conductive line 242. The third conductive line 242 is electrically connected to a bit line (not shown).

A drain region at one side of the first switch device SW1 is electrically connected to a fourth conductive line 244 extending in the X direction. Also, the drain region at one side of the first switch device SW1 is electrically connected to the second conductive line 144.

In detail, a fifth plug 234 extending along the Z direction from the fourth conductive line 244 to the second conductive line 144 through the drain region at one side of the first switch device SW1 is formed. The fourth conductive line 244, the drain region at one side of the first switch device SW1, and the second conductive line 144 are electrically connected to each other by the fifth plug 234. Also, the fourth conductive line 244 is electrically connected to a complementary bit line (not shown). Accordingly, the input terminal in1 of the first inverter 12 of FIG. 1 may be connected to the complementary bit line.

The third, fourth, and fifth plugs 146, 232, and 234, the third conductive line 242, and the fourth conductive line 244 may include a conductive material. Examples of the conductive material include aluminum, copper, silver, and gold.

In FIG. 4B, the third and fourth conductive lines 242 and 244 are shown to extend in parallel in the X direction, but example embodiments are not limited thereto. According to an example embodiment, the third and fourth conductive lines 242 and 244 may extend in parallel in the Y direction. According to another example embodiment, the third and fourth conductive lines 242 and 244 may extend in different directions at different levels.

Also, for convenience of description, FIG. 4B only shows the first inverter 12, and the first and second switch devices SW1 and SW3, but the second inverter 14 may be disposed on the semiconductor substrate 100 with the same structure as the first inverter 12, and the third and fourth switch devices SW2 and SW4 may be disposed on the semiconductor layer 200 with the same structure as the first and second switch devices SW1 and SW3.

However, example embodiment of the inventive concepts are not limited thereto. The third and fourth switch devices SW2 and SW4 may have the same structure as the first and second switch devices SW1 and SW3, but may be disposed on another semiconductor layer on the semiconductor layer 200.

In a semiconductor having a device area occupied by a semiconductor device and a memory cell area occupied by a memory cell, when first and second inverters and first through fourth switch devices are disposed on a same substrate containing both the device area and the memory cell area, the device area is increased, thereby causing a decrease in the space devoted to the memory cell area. Further, if the first through fourth switch devices are formed while limiting the device area so as to prevent the space devoted to the memory cell area from decreasing, it is difficult to obtain a process margin, and thus defects may be generated during a process for forming a contact pattern.

However, according to the semiconductor device 10, the first NMOS transistor N1 and the first PMOS transistor P1 included in the first inverter 12 are formed on the semiconductor substrate 100, and the first and second switch devices SW1 and SW3 for improving the sensing efficiency are formed on the semiconductor layer 200 at a higher level than the semiconductor substrate 100 in the Z direction. Also, although not shown in FIG. 4B, the second NMOS transistor N2 and the second PMOS transistor P2 included in the second inverter 14 are formed on the semiconductor substrate 100, and the third and fourth switch devices SW2 and SW4 are formed on the semiconductor layer 200. Accordingly, by using the semiconductor device 10, a memory cell area of a semiconductor memory device employing the semiconductor device 10 may be prevented from decreasing, and the semiconductor memory device may be easily miniaturized and highly integrated. Also, since a process margin is obtained under a limited area, the number of defects generated during manufacturing processes may be reduced.

Figure 5A:
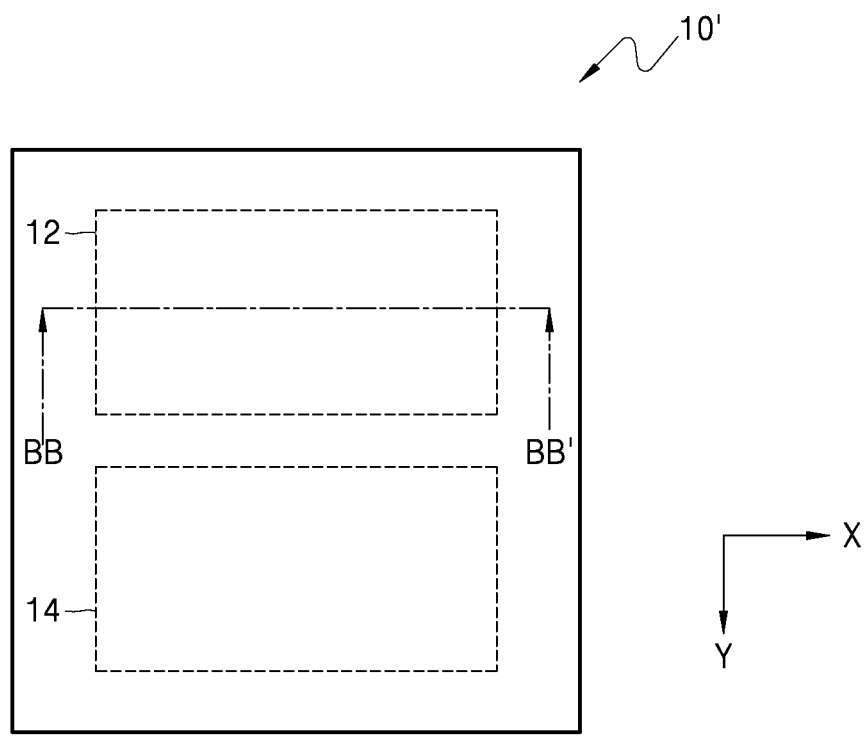
FIG. 5A is a schematic plan layout of a semiconductor device according to another example embodiment of the inventive concepts.
Figure 5B:
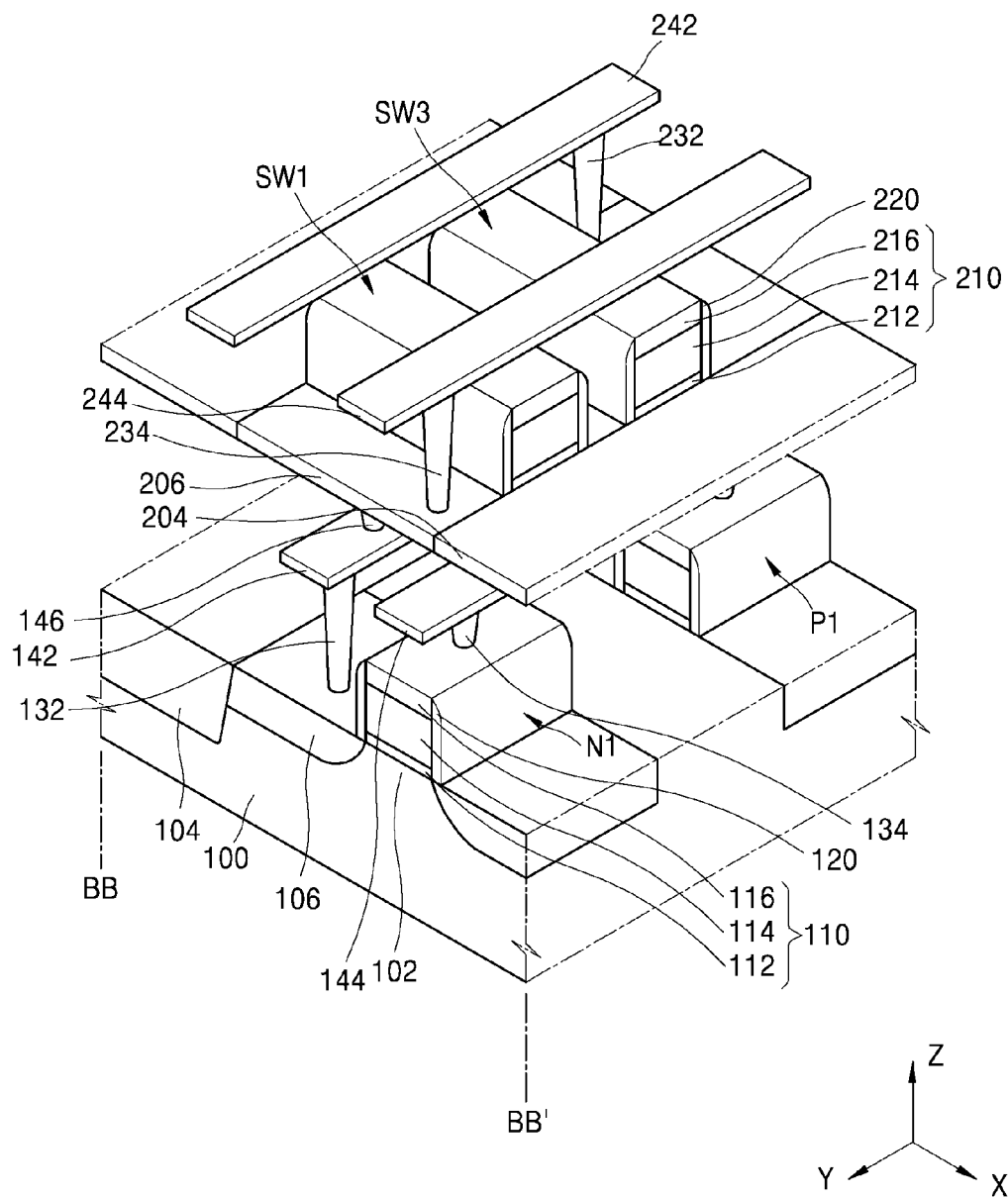
FIG. 5B is a cross-sectional view of elements taken along line BB-BB' of FIG. 5A.

FIG. 5A is a schematic plan layout of a semiconductor device 10' according to another example embodiment of the inventive concepts, and FIG. 5B is a cross-sectional view of elements taken along line BB-BB' of FIG. 5A. In FIGS. 5A and 5B, same components as those of FIGS. 4A through 4D are not illustrated. While describing the semiconductor device 10' with respect to FIGS. 5A and 5B, repeated descriptions with respect to FIGS. 4A through 4D are not provided and only differences are described.

Referring to FIGS. 5A and 5B, the isolating film 104 defining an active region is formed on the semiconductor substrate 100. The isolating film 104 may have a thickness from a top surface of the semiconductor substrate 100 in the Z direction, and may extend in the Y direction.

The source/drain region 106 is formed on the active region defined by the isolating film 104, and the channel region 102 is defined by the source/drain regions 106. The source/drain region 106 and the channel region 102 may extend in the Y direction.

The gate structure 110 extending in the Y direction is formed on the channel region 102, and the spacer 120 is formed on the side wall of the gate structure 110.

The isolating film 204 defining the active region is formed on the semiconductor layer 200. The isolating film 204 may have a thickness from the top surface to the bottom surface of the semiconductor layer 200, and may extend in the Y direction.

The drain region 206 and the common source region 208 are formed in the active region defined by the isolating film 204, and the channel region 202 is defined by the drain region 206 and the common source region 208. The drain region 206, the common source region 208, and the channel region 202 may extend in the X direction.

The gate structure 210 extending in the X direction is formed on the channel region 202, and the spacer 220 is formed on the side wall of the gate structure 210.

As shown in FIG. 5B, an extending direction of the channel region 102 of the first NMOS transistor N1 and the first PMOS transistor P1 formed on the semiconductor substrate 100 may orthogonally cross an extending direction of the channel region 202 of the first and second switch devices SW1 and SW3 formed on the semiconductor layer 200.

However, alternatively, the extending direction of the channel region 102 of the first NMOS transistor N1 and the first PMOS transistor P1 formed on the semiconductor substrate 100 may variously cross the extending direction of the channel region 202 of the first and second switch devices SW1 and SW3 formed on the semiconductor layer 200.

Similarly, an extending direction of the gate structure 110 of the first NMOS transistor N1 and the first PMOS transistor P1 formed on the semiconductor substrate 100 may orthogonally cross an extending direction of the gate structure 210 of the first and second switch devices SW1 and SW3 formed on the semiconductor layer 200, but is not limited thereto.

As such, by classifying and forming inverters and switch devices on the semiconductor substrate 100 and the semiconductor layer 200, which are at different levels, a layout of active regions, source/drain regions, and channel regions of the semiconductor substrate 100 and the semiconductor layer 200 may vary.

FIGS. 6A through 6F are diagrams for describing a method of manufacturing the semiconductor device 10 of FIG. 1, according to an example embodiment of the inventive concepts. FIGS. 6A through 6F are cross-sectional views taken along line AB-AB' of FIG. 4B. In FIGS. 4A, 4B, and FIGS. 6A through 6F, like reference numerals denote like elements, and details thereof are not repeated here. Also, like FIGS. 4A and 4B, the second inverter 14 is formed on the semiconductor substrate 100 during the same process as the first inverter 12, and the third and fourth switch devices SW2 and SW4 are formed on the semiconductor layer 200 during the same process as the first and second switch devices SW1 and SW3 in FIGS. 6A through 6F, and thus details thereof are not repeated here.

Figure 6A:
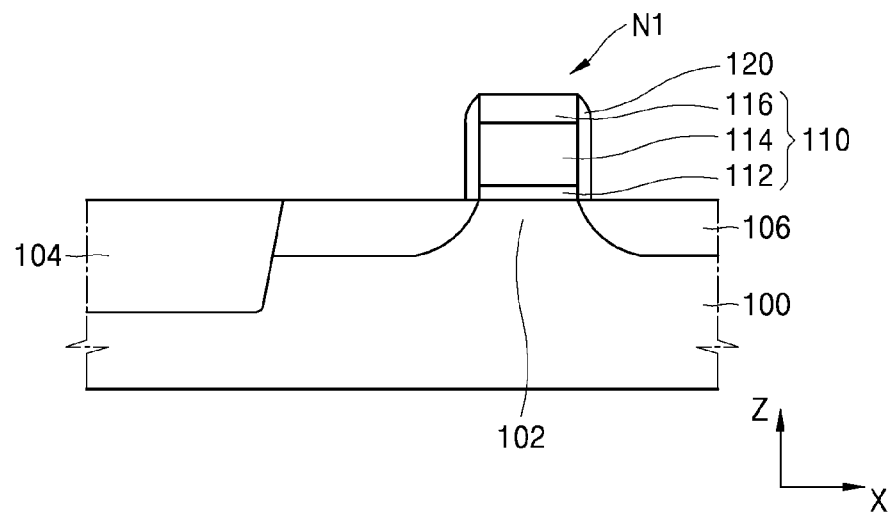
FIGS. 6A through 6F are diagrams for describing a method of manufacturing the semiconductor device of FIG. 1, according to an example embodiment of the inventive concepts.

Referring to FIG. 6A, a mask pattern (not shown) is formed on the semiconductor substrate 100, and a trench is formed in the semiconductor substrate 100 via an etching process by using the mask pattern as an etch mask. The etching process may use a wet etching process or a dry etching process. An insulating material layer (not shown) is formed to cover the top surface of the semiconductor substrate 100 and fill the trench, an isolating film 104 is exposed on the top surface of the semiconductor substrate 100 via a planarization process, such as a chemical mechanical polishing (CMP) process, and an active region is defined.

A gate dielectric film, a gate electrode layer, and a capping material film, which are not shown, are sequentially formed on the top surface of the semiconductor substrate 100 via a chemical vapor deposition (CVD) process, a physical vapor deposition (PVD) process, or an atomic layer deposition (ALD) process. According to an embodiment, a surface treating process, such as a nitrification process or an ozonization process, may be performed on the semiconductor substrate 100 on which the gate dielectric film is formed, before the gate electrode layer is formed. By performing the surface treating process, films of foreign materials are prevented from being formed on an interface between the gate dielectric film and the gate electrode layer, thereby improving reliabilities and electric characteristics of transistors formed during following processes.

A mask pattern (not shown) is formed on the capping material film, and the gate structure 110 including the gate dielectric film pattern 112, the gate electrode pattern 114, and the capping pattern 116 is formed via an etching process using the mask pattern as an etch mask.

A spacer material layer (not shown) covering the gate structure 110 is formed, and the spacer 120 covering the side wall of the gate structure 110 is formed via a planarization process or an etch back process.

The source/drain region 106 is formed by doping two sides of the gate structure 110 on the semiconductor substrate 100 with p- or n-type impurities, and the channel region 102 is defined on a bottom surface of the gate structure 110, thereby forming the first NMOS transistor N1 and the first PMOS transistor P1 (refer to FIG. 4A).

Figure 6B:
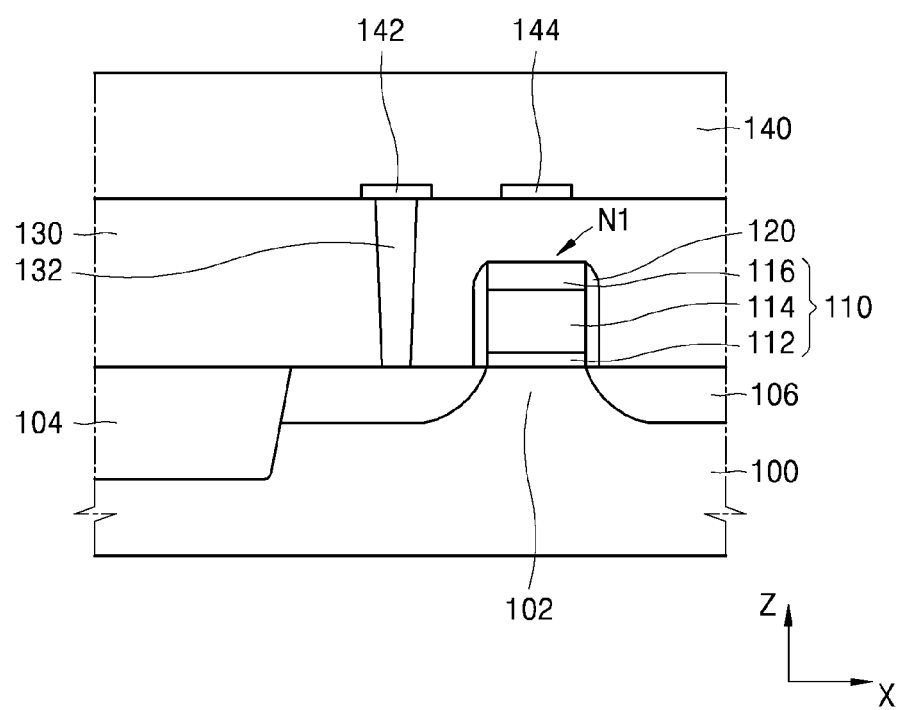

Referring to FIG. 6B, a first interlayer dielectric layer 130 covering the top surface of the semiconductor substrate 100, and the first NMOS transistor N1 and the first PMOS transistor P1 is formed. The first interlayer dielectric layer 130 may be formed via a CVD process. The first interlayer dielectric layer 130 may include at least one insulating material from silicon oxide, silicon nitride, and silicon oxynitride.

Holes (not shown) exposing the source/drain region of the first NMOS transistor N1 and the source/drain region of the first PMOS transistor P1 are formed through the first interlayer dielectric layer 130. Also, holes (not shown) exposing the gate structure of the first NMOS transistor N1 and the gate structure of the first PMOS transistor P1 are formed through the first interlayer dielectric layer 130.

The holes may be formed by forming a mask pattern (not shown) on the first interlayer dielectric layer 130, and dry-etching the first interlayer dielectric layer 130 by using the mask pattern as an etch mask.

A conductive material layer covering the top surface of the first interlayer dielectric layer 130 and filling the holes is formed, and then the conductive material layer is removed via an etching process such that the top surface of the first interlayer dielectric layer 130 is exposed, thereby forming the first plug 132 and the second plug 134 (refer to FIG. 4B). The conductive material layer may be formed via a CVD process, and the etching process may be performed by performing at least one of a dry etching process and a CMP process.

A conductive material layer is formed on the top surface of the first interlayer dielectric layer 130 and then is patterned to form the first conductive line 142 connected to the first plug 132 and the second conductive line 144 connected to the second plug 134. The first and second conductive lines 142 and 144 may extend in parallel.

In FIG. 6B, the first and second conductive lines 142 and 144 are formed at the same level based on the top surface of the semiconductor substrate 100, i.e., are formed simultaneously on the top surface of the first interlayer dielectric layer 130, but are not limited thereto. The first and second conductive lines 142 and 144 may be formed at different levels based on the top surface of the semiconductor substrate 100. The first interlayer dielectric layer 130 may include a plurality of layers, or an additional dielectric layer may be formed on the first interlayer dielectric layer 130 so as to realize a level difference between the first and second conductive lines 142 and 144. Here, the first and second plugs 132 and 134 may have different thicknesses adaptively to the level difference between the first and second conductive lines 142 and 144.

A second interlayer dielectric layer 140 covering the top surface of the first interlayer dielectric layer 130, and the first and second conductive lines 142 and 144 is formed. The second interlayer dielectric layer 140 may be formed via a CVD process. The second interlayer dielectric layer 140 may include at least one insulating material from silicon oxide, silicon nitride, and silicon oxynitride, and may include a plurality of layers.

Although not shown in FIG. 6B, holes (not shown) penetrating through the second interlayer dielectric layer 140 between the common source region 208 (refer to FIG. 6E) of the first and second switch devices SW1 and SW3 that is formed later, and the first conductive line 142 may be formed, and the holes may be filled with a conductive material to form the third plug 146 (refer to FIG. 4B).

Figure 6C:
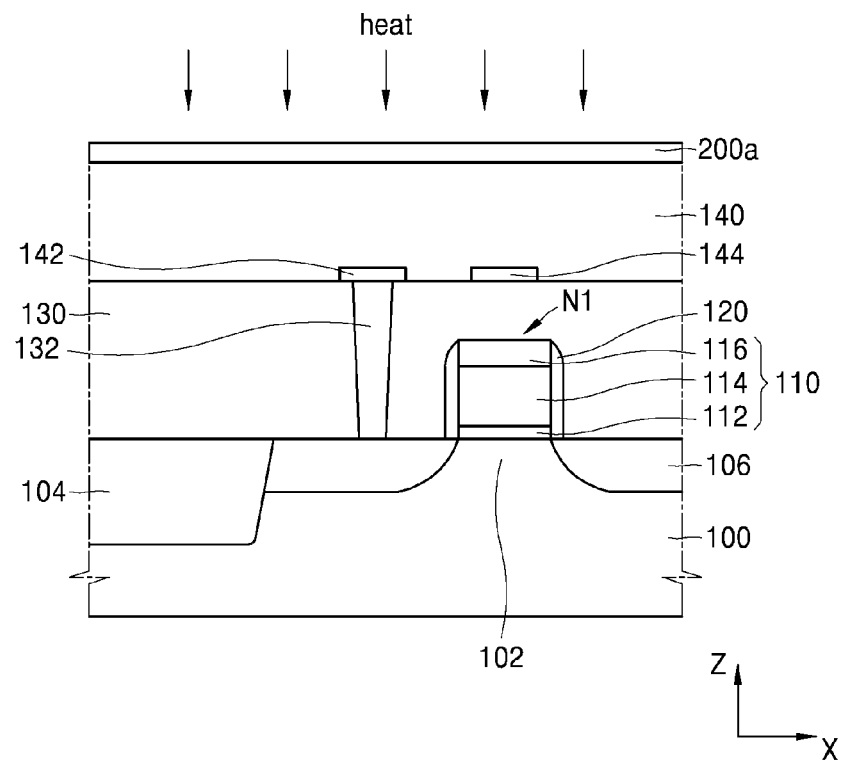
Figure 6D:
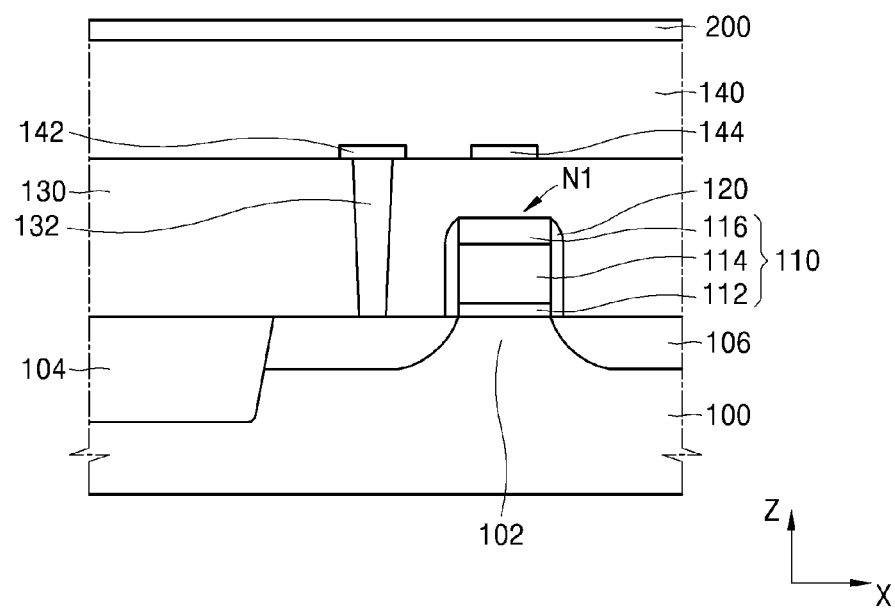

Referring to FIGS. 6C and 6D, a preliminary semiconductor layer 200a is formed on the second interlayer dielectric layer 140. The preliminary semiconductor layer 200a may be formed of amorphous silicon. The preliminary semiconductor layer 200a may be formed via a CVD process using di-isopropylaminosilane (DIPAS) or disilane ($Si_2H_6$) as a precursor. The CVD process may be performed at a temperature of 400° C. The preliminary semiconductor layer 200a may be formed as an amorphous silicon thin film so that the channel region 202 (refer to FIG. 6E) formed via a following process is fully depleted. The preliminary semiconductor layer 200a may be formed as an amorphous silicon thin film having a thickness from about 5 to about 20 nm.

The semiconductor layer 200 is formed by changing an amorphous silicon layer to a polycrystalline silicon layer via an annealing process of applying heat to the preliminary semiconductor layer 200a. The annealing process may be performed via a rapid thermal process.

As such, the semiconductor layer 200 is a polycrystalline silicon layer, instead of a single crystalline silicon layer, via a selective epitaxial growth process and/or a lateral epitaxial growth process. Accordingly, manufacturing processes may be simplified and manufacturing costs may be reduced.

Figure 6E:
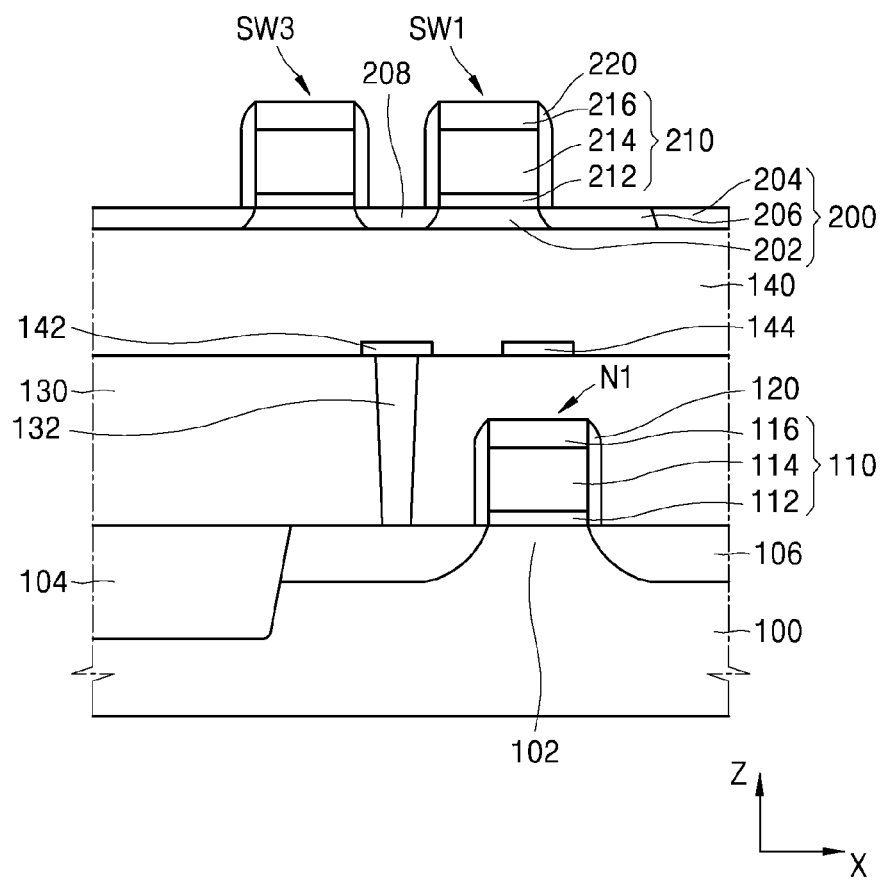

Referring to FIG. 6E, a trench is formed in the semiconductor layer 200 via an etching process, and the trench is filled with an insulating material to form the isolating film 204.

The trench is formed in the semiconductor layer 200 by forming a mask pattern (not shown) on the semiconductor layer 200, and then performing an etching process using the mask pattern as an etch mask. The etching process may be a wet etching process or a dry etching process. An insulating material layer (not shown) is formed to cover the top surface of the semiconductor layer 200 and fill the trench, and then is flattened to expose the isolating film 204 on the top surface of the semiconductor layer 200 and define an active region.

A gate dielectric film, a gate electrode layer, and a capping material film, which are not shown, are sequentially formed on the top surface of the semiconductor layer 200 via a CVD, PVD, or ALD process. Like the gate structure 210 described above, the gate structure 210 including the gate dielectric film pattern 212, the gate electrode pattern 214, and the capping pattern 216 is formed via patterning process, and then the spacer 220 covering the side wall of the gate structure 210 is formed.

The drain region 206 and the common source region 208 are formed by doping two sides of the gate structure 210 on the semiconductor layer 200 with p- or n-type impurities, and the channel region 202 is defined on the bottom surface of the gate structure 210, thereby forming the first and second switch devices SW1 and SW3. Here, the bottom surfaces of the drain region 206 and the common source region 208 are coplanar with the bottom surface of the semiconductor layer 200. Also, the common source region 208 is formed to overlap the third plug 146 (refer to FIG. 4B).

Figure 6F:
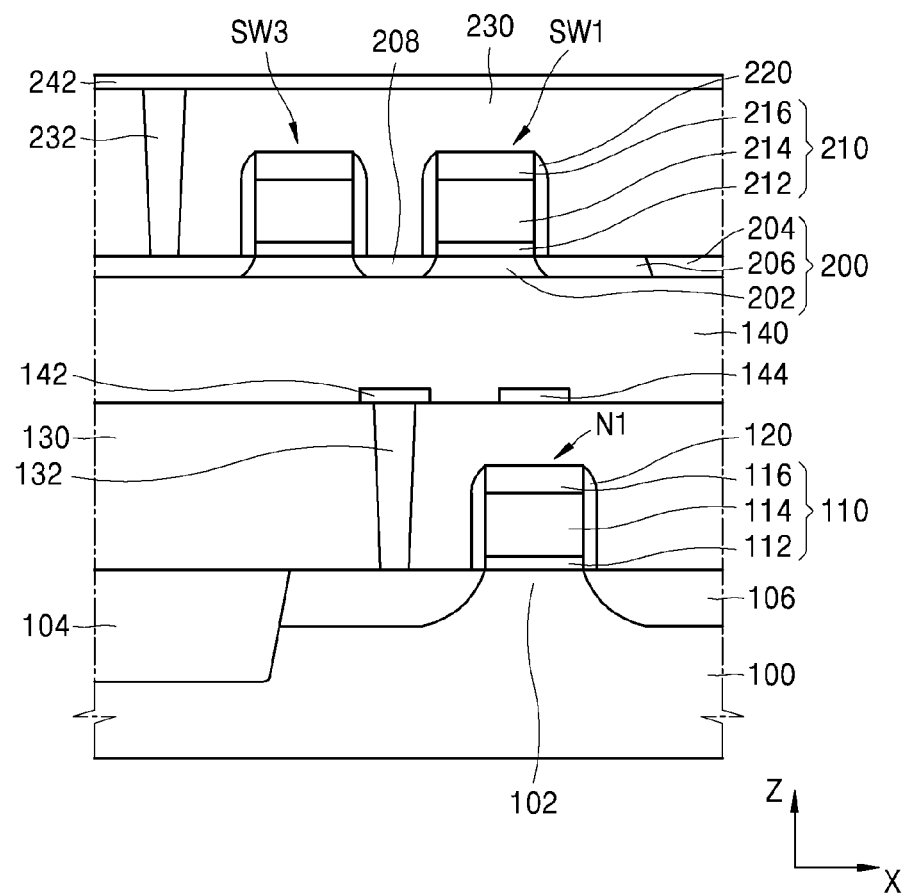

Referring to FIG. 6F, a third interlayer dielectric layer 230 covering the top surface of the semiconductor layer 200, and the first and second switch devices SW1 and SW3 is formed. The third interlayer dielectric layer 230 may be formed via a CVD process. The third interlayer dielectric layer 230 may include at least one material from among silicon oxide, silicon nitride, and silicon oxynitride.

Holes (not shown) exposing the drain region of the second switch device SW3 through the third interlayer dielectric layer 230 are formed. Also, holes (not shown) exposing the drain region of the first switch device SW1 through the third interlayer dielectric layer 230 are formed.

The holes are filled to form the fourth plug 232 and the fifth plug 234 (refer to FIG. 4D). The third conductive line 242 connected to the fourth plug 232 and the fourth conductive line 244 connected to the fifth plug 234 are formed on the top surface of the third interlayer dielectric layer 230. The third and fourth conductive lines 242 and 244 may be formed in parallel. The third and fourth conductive lines 242 and 244 are respectively connected to a bit line (not shown) and a complementary bit line (not shown), and thus the semiconductor device 10 may be formed.

Referring to FIG. 6F, the third and fourth conductive lines 242 and 244 are formed at the same level based on the top surface of the semiconductor layer 200, i.e., are together formed on the top surface of the third interlayer dielectric layer 230, but are not limited thereto. The third and fourth conductive lines 242 and 244 may be formed at different levels based on the top surface of the semiconductor layer 200. Here, the fourth and fifth plugs 232 and 234 may have different thicknesses adaptively to the different levels of the third and fourth conductive lines 242 and 244.

Figure 7:
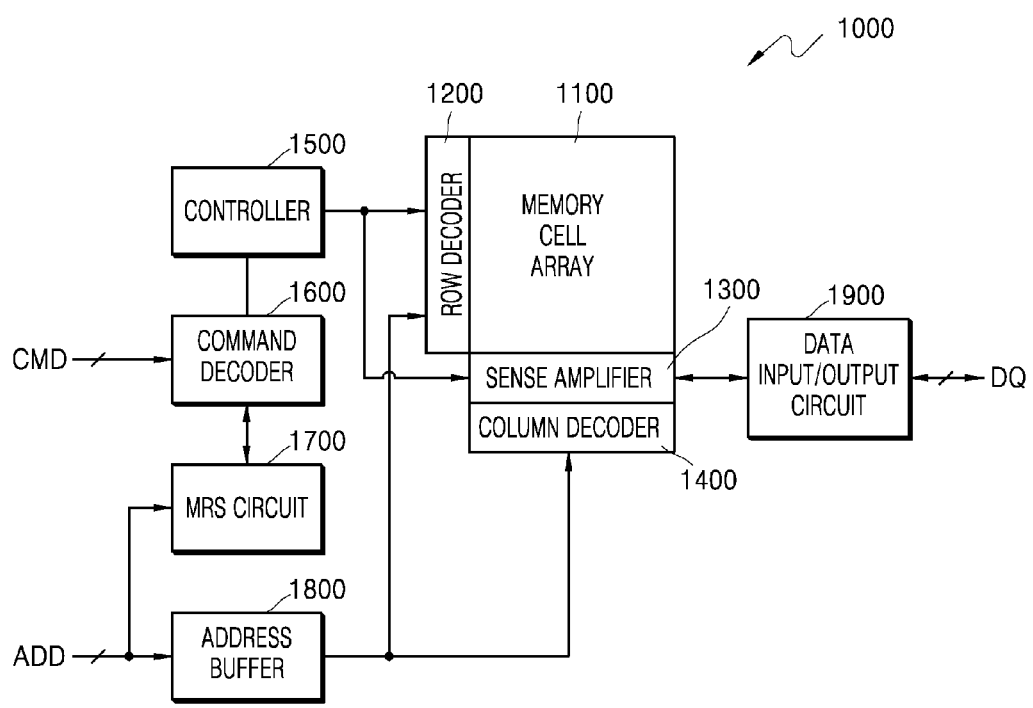
FIG. 7 is a block diagram of a semiconductor memory device including a semiconductor device according to an example embodiment of the inventive concepts.

FIG. 7 is a block diagram of a semiconductor memory device including a semiconductor device according to an example embodiment of the inventive concepts.

Referring to FIG. 7, a semiconductor memory device 1000 may include a memory cell array 1100, a row decoder 1200, a sense amplifier 1300, a column decoder 1400, a controller 1500, a command decoder 1600, a mode register set (MRS) circuit 1700, an address buffer 1800, and a data input/output circuit 1900. The semiconductor memory device 1000 may operate as follows:

The memory cell array 1100 is a data storage space in which a plurality of memory cells are arranged in a row direction and a column direction. A memory cell may be any one of a dynamic random access memory (DRAM) cell, a static RAM (SRAM) cell, a resistive RAM (RRAM) cell, a phase RAM (PRAM) cell, a magnetic RAM (MRAM) cell, and a spin-transfer-torque MRAM (STT-MRAM).

The sense amplifier 1300 may be any one of the semiconductor device 10 of FIG. 4B and the semiconductor device 10' of FIG. 5B. Accordingly, the semiconductor memory device 1000 has an improved sensing efficiency, is easily miniaturized, is easily highly integrated, and is unlikely to have defects by obtaining a process margin.

Data DQ received through the data input/output circuit 1900 is written on the memory cell array 1100 based on an address signal ADD, and the data DQ read from the memory cell array 1100 based on the address signal ADD is output through the data input/output circuit 1900. In order to assign a memory cell on or from which the data DQ is to be written or read, the address signal ADD is input to the address buffer 1800. The address buffer 1800 temporarily stores the address signal ADD received from the outside of the semiconductor memory device 1000.

In order to assign a word line connected to a memory cell to or from which data is to be input or output, the row decoder 1200 decodes a row address in the address signal ADD output from the address buffer 1800. In other words, the row decoder 1200 enables the word line by decoding the row address output from the address buffer 1800 in a data write or read mode.

In order to assign a bit line connected to a memory cell to or from which data is to be input or output, the column decoder 1400 decodes a column address in the address signal ADD output from the address buffer 1800.

The command decoder 1600 receives a command signal CMD, such as "/CBR" or "/CKE", received from the outside of the semiconductor memory device 1000, decodes the command signal CMD, and internally generates a decoded command signal. The MRS circuit 1700 sets an internal mode register in response to an MRS command for assigning an operation mode of the semiconductor memory device 1000, and the address signal ADD. The controller 1500 may control operations of the semiconductor memory device 1000 in response to a command output from the command decoder 1400.

Although not shown in FIG. 7, the semiconductor memory device 1000 may further include a clock circuit for generating a clock signal, and a power supply circuit for generating or distributing an internal voltage by receiving a power voltage applied from the outside of the semiconductor memory device 1000.

Figure 8:
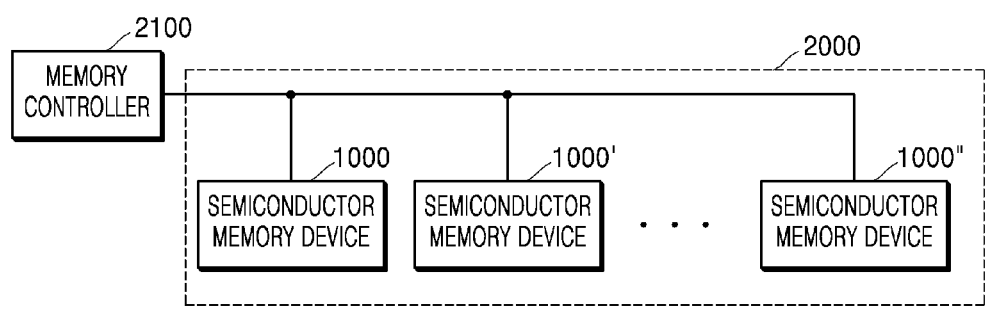
FIG. 8 is a block diagram of a memory module including the semiconductor memory device of FIG. 7.

FIG. 8 is a block diagram of a memory module including the semiconductor memory device 1000 of FIG. 7.

Referring to FIG. 8, a memory module 2000 may include at least one semiconductor memory device 1000, 1000', and 1000". The semiconductor memory devices 1000 through 1000" may be controlled by a memory controller 2100. Since structures and operations of the semiconductor memory devices 1000 through 1000" are the same as those of the semiconductor memory device 1000 described above, details thereof are not repeated here.

The semiconductor memory devices 1000 through 1000" and/or the memory controller 2100 may be mounted on a main board (not shown) of the memory module 2000 by using a package having one of various shapes. For example, the semiconductor memory devices 1000 through 1000" and/or the memory controller 2100 may be mounted on the main board by using any one of packages, such as a package on package (PoP), a ball grid arrays (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi chip package (MCP), a wafer-level fabricated package (WFP), and a wafer-level processed stack package (WSP).

Figure 9:
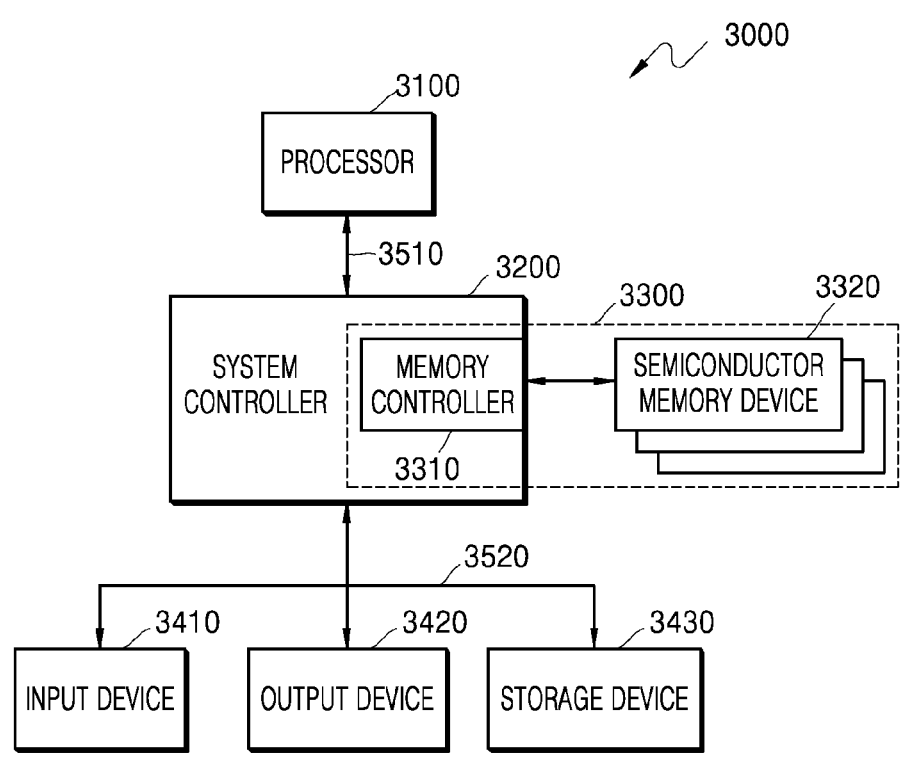
FIG. 9 is a block diagram of a computing system including the semiconductor memory device of FIG. 7.

FIG. 9 is a block diagram of a computing system including the semiconductor memory device 1000 of FIG. 7.

Referring to FIG. 9, a computing system 3000 includes a processor 3100, a system controller 3200, and a memory system 3300.

The computing system 3000 may further include a processor bus 3510, an expansion bus 3520, an input device 3410, an output device 3420, and a storage device 3430. The memory system 3300 includes a semiconductor memory device 3320 and a memory controller 3310. The semiconductor memory device 3320 may be at least one of the semiconductor memory devices 1000 to 1000". The memory controller 3310 may be included in the system controller 3200.

The processor 3100 may execute various computing systems like executing certain software for performing certain calculations or tasks. For example, the processor 3100 may be a microprocessor or a central processing unit (CPU). The processor 3100 may be connected to the system controller 3200 through the processor bus 3510 including an address bus, a control bus and/or a data bus. The system controller 3200 is connected to the expansion bus 3520, such as a peripheral component interconnection (PCI) bus. Accordingly, the processor 3100 may control at least one input device 3410, such as a keyboard or a mouse, at least one output device 3420, such as a printer or a display device, or at least one storage device 3430, such as a hard disk drive, a solid state drive, or a CD-ROM, through the system controller 3200.

The memory controller 3310 may control the semiconductor memory device 3320 to perform commands provided by the processor 3100. The semiconductor memory device 3320 may store data provided from the memory controller 3310, and provide the stored data to the memory controller 3310. The semiconductor memory device 3320 may include a plurality of memory chips, such as a DRAM chip, an SRAM chip, or a nonvolatile memory chip. The computing system 3000 may be a desktop computer, a laptop, a workstation, or a hand-held device.

While the inventive concepts has been particularly shown and described with reference to example embodiments thereof, it will be understood that various changes in form and details may be made therein without departing from the spirit and scope of the following claims.

What is claimed is:

1. A semiconductor device comprising:
   a substrate;
   a first inverter disposed on the substrate, the first inverter configured to receive a voltage from one of a bit line and a complementary bit line;
   a semiconductor layer disposed on the first inverter, the semiconductor layer including a common source region; and
   first and second devices disposed on the semiconductor layer, the first and second witch devices configured to adjust a threshold voltage of the first inverter to a voltage level of one of the bit line and the complementary bit line, the common source region shared by the first and second switch devices.

2. The semiconductor device of claim 1, wherein the semiconductor layer is formed of polycrystalline silicon.

3. The semiconductor device of claim 1, wherein the semiconductor layer comprises:
   a channel region of each of the first and second switch devices, wherein
   the channel region is fully depleted.

4. The semiconductor device of claim 1, wherein the semiconductor layer comprises:
   drain regions of the first and second switch devices, wherein
   bottom surfaces of the common source region and the drain regions of the first and second switch devices are coplanar with a bottom surface of the semiconductor layer.

5. The semiconductor device of claim 1, wherein the first inverter comprises:
   a pair of NMOS and PMOS transistors, and wherein
   the substrate includes source and drain regions of each of the NMOS and PMOS transistors, and
   the source and drain regions of each of the NMOS and PMOS transistors are separate from a bottom surface of the substrate.

6. The semiconductor device of claim 1, wherein the first inverter comprises:
   a pair of NMOS and PMOS transistors, and wherein
   the substrate includes a channel region of each of the NMOS and PMOS transistors, the channel region of the substrate extending in a first direction, and
   the semiconductor layer includes a channel region of each of the first and second switch devices, the channel region of the semiconductor layer extending in the first direction.

7. The semiconductor device of claim 1, wherein the first inverter comprises:
   a pair of NMOS and PMOS transistors, and wherein
   the substrate includes a channel region of each of the NMOS and PMOS transistors, the channel region of the substrate extending in a first direction, and
   the semiconductor layer includes a channel region of each of the first and second switch devices, the channel region of the semiconductor layer extending in a second direction that is different from the first direction.

8. The semiconductor device of claim 1, wherein the first inverter comprises:
   a pair of NMOS and PMOS transistors, and wherein
   the NMOS and PMOS transistors each include a channel region, source and drain regions and a gate structure, the channel region is disposed on the substrate, the source and drain regions are respectively disposed on two sides of the channel region on the substrate and the gate structure is disposed on the channel region,
   one of the source and drain regions of the NMOS transistor is electrically connected to one of the source and drain regions of the PMOS transistor, and
   the gate structure of the NMOS transistor is electrically connected to the gate structure of the PMOS transistor.

9. The semiconductor device of claim 1, wherein the first and second switch devices each comprise:
   a channel region disposed on the semiconductor layer;
   the common source region and a drain region respectively disposed on two sides of the channel region on the semiconductor layer; and
   a gate structure disposed on the channel region.

10. The semiconductor device of claim 1, wherein the bit line and the complementary bit line are disposed on the first and second switch devices,
    the complementary bit line is electrically connected to a drain region of the first switch device disposed on the semiconductor layer, and
    the bit line is electrically connected to a drain region of the second switch device disposed on the semiconductor layer.

11. The semiconductor device of claim 1, further comprising:
    a second inverter disposed on the substrate, the second inverter cross-coupled to the first inverter, and the second inverter receiving a voltage from one of the bit line and the complementary bit line; and
    third and fourth switch devices disposed on the semiconductor layer, the third and fourth switch devices adjusting a threshold voltage of the second inverter to the voltage level of one of the bit line and the complementary bit line.

12. The semiconductor device of claim 11, wherein a pair of the first and third switch devices operate independently from a pair of the second and fourth switch devices.

13. A sense amplifier comprising:
    the semiconductor device of claim 11.

14. A semiconductor device comprising:
    first and second inverters disposed on a substrate, the first and second inverters cross-coupled between a bit line and a complementary bit line, the first and second inverters configured to sense a difference between voltage levels of the bit line and the complementary bit line; and
    first and second switch device groups disposed on a semiconductor layer at a higher level than the substrate, the first and second switch device groups configured to respectively adjust threshold voltages of the first and second inverters to a voltage level of one of the bit line and the complementary bit line, the semiconductor layer including a common source shared by switches in the first switch device group.

15. The semiconductor device of claim 14, wherein the semiconductor layer is formed of polycrystalline silicon.

16. A semiconductor device having a substrate and a semiconductor layer formed on the substrate, the device comprising:
    a first inverter and a second inverter on the substrate; and switches on the semiconductor layer such that the switches are disposed at a different layer from the first inverter and the second inverter, the switches configured to set a threshold voltage of the first inverter and a threshold voltage of the second inverter to a same voltage level, the switches including, first switching devices configured to selectively connect an output terminal and an input terminal of the first inverter to a same first one of a bit line and a complementary bit line in a matching phase.

17. The semiconductor device of claim 16, wherein the switches further comprise:

second switching devices configured to selectively connect an output terminal and an input terminal of the second inverter to a same second one of the bit line and the complementary bit line in the matching phase.

18. The semiconductor device of claim 16, wherein each of the switches includes a source, a channel and a drain, and the source, the channel and the drain of the switches is formed on the semiconductor layer, the source being a common source shared between.

19. The semiconductor device of claim 16, wherein each of the first inverter and the second inverter includes an NMOS transistor and a PMOS transistor, the NMOS transistor and the PMOS transistor each have a source and a drain, and the source and the drain of the NMOS transistor and the PMOS transistor are formed on the substrate.

20. The semiconductor device of claim 16, wherein the semiconductor layer is formed of polycrystalline silicon.

* * * * *